US008669617B2

(12) United States Patent
Jan et al.

(10) Patent No.: US 8,669,617 B2
(45) Date of Patent: Mar. 11, 2014

(54) MULTI-GATE TRANSISTORS

(75) Inventors: Chia-Hong Jan, Portland, OR (US);
Curtis Tsai, Portland, OR (US);
Joodong Park, Portland, OR (US);
Jeng-Ya D. Yeh, Portland, OR (US);
Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 12/978,182

(22) Filed: Dec. 23, 2010

(65) Prior Publication Data
US 2012/0161237 A1  Jun. 28, 2012

(51) Int. Cl.
*H01L 27/088* (2006.01)
(52) U.S. Cl.
USPC ...... 257/368; 257/E27.06; 257/401; 257/315; 257/286; 257/197; 438/275; 438/16; 438/216; 438/218; 438/197
(58) Field of Classification Search
USPC ............ 257/368, E27.06, 401, 315, 286, 197, 257/284, 102, E21.53; 438/275, 16, 216, 438/218, 197
See application file for complete search history.

(56) References Cited

U.S. PATENT DOCUMENTS

| 6,670,248 | B1 | 12/2003 | Ang |
| 7,541,239 | B2 | 6/2009 | Curello |
| 7,718,479 | B2 | 5/2010 | Kavalieros |
| 2006/0105522 | A1* | 5/2006 | Steimle et al. ................ 438/257 |
| 2007/0052037 | A1 | 3/2007 | Luan |
| 2009/0001415 | A1 | 1/2009 | Lindert |
| 2010/0244207 | A1 | 9/2010 | Takayanagi |
| 2011/0042751 | A1* | 2/2011 | Kim et al. ...................... 257/369 |

FOREIGN PATENT DOCUMENTS

| KR | 10-2009-0058236 A | 6/2009 |
| TW | 200713469 A | 4/2007 |
| TW | 200845372 A | 11/2008 |
| TW | 200939474 A | 9/2009 |
| WO | 2012/087987 A2 | 6/2012 |
| WO | 2012/087987 A3 | 9/2012 |

OTHER PUBLICATIONS

International Search Report and Written Opinion received for PCT Patent Application No. PCT/US2011/065946, mailed on Jul. 20, 2012, 10 pages.
Robert Chau, "Advanced Metal Gate/High-K Dielectric Stacks for High-Performance CMOS Transistors," AVS 5th Int. Microelectronics Interfaces Conf., 2004, pp. 3-5.
Robert Chau et al., "High-K/Metal-Gate Stack and Its MOSFET Characteristics," IEEE Electron Device Letters, 2004, pp. 408-410, vol. 25, No. 6.
R.A. Donaton et al., "Integration of Cu and low-K dielectrics: effect of hard mask and dry etch on electrical performance of damascene structures," Microelectronic Engineering, 2001, pp. 277-283, vol. 55.

(Continued)

*Primary Examiner* — Cathy N Lam

(57) ABSTRACT

Provided are devices having at least three and at least four different types of transistors wherein the transistors are distinguished at least by the thicknesses and or compositions of the gate dielectric regions. Methods for making devices having three and at least four different types of transistors that are distinguished at least by the thicknesses and or compositions of the gate dielectric regions are also provided.

19 Claims, 12 Drawing Sheets

(56) References Cited

OTHER PUBLICATIONS

U S. Appl. No. 12/858,770 for "High-Voltage Transistor Architectures, Processes of Forming Same, and Systems Containing Same," filed Aug. 18, 2010.

Office Action Received for Taiwanese Patent Application No. 100147135, mailed on Nov. 8, 2013, 11 Pages of Taiwanese Office Action and 12 Pages of English Translation.

* cited by examiner

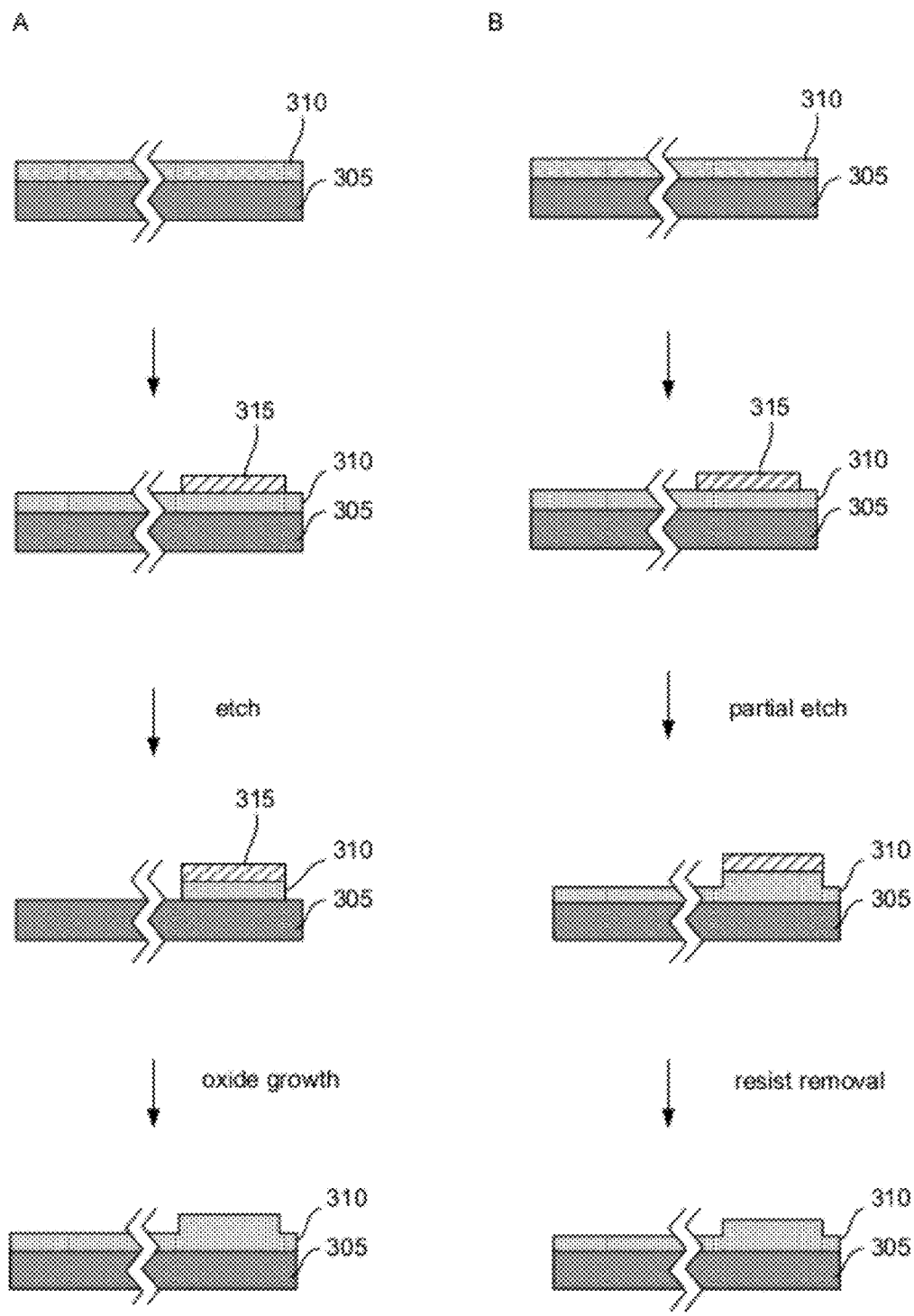
FIGURES 3A-B

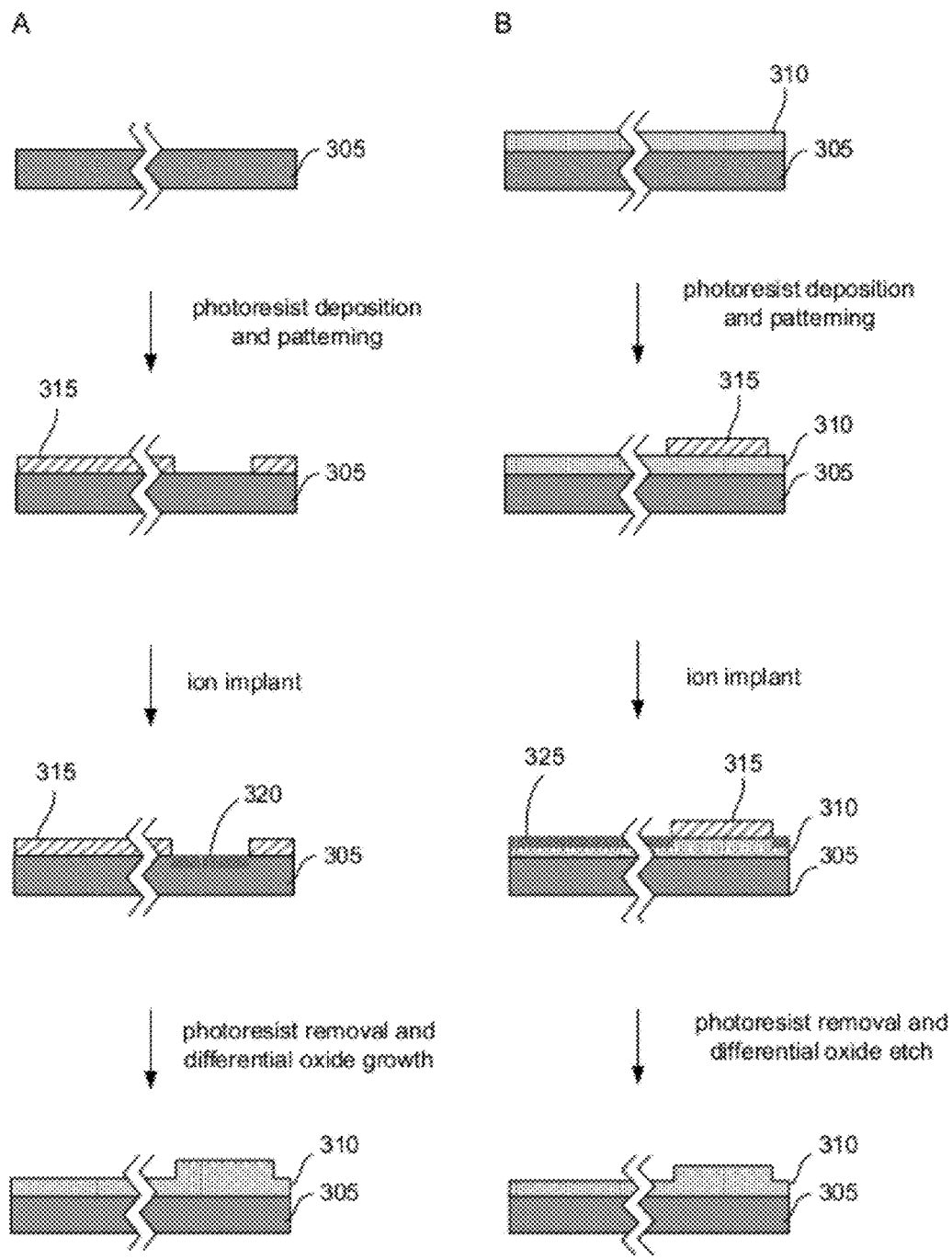
FIGURES 4A-B

US 8,669,617 B2

MULTI-GATE TRANSISTORS

BACKGROUND OF THE INVENTION

1. Field of the Invention

The embodiments of the present invention relate generally to semiconductor microelectronic devices, semiconductor logic devices, and transistors.

2. Background Information

The desire for ever-smaller more highly integrated circuits (IC) devices places enormous demands on the techniques and materials used to construct the devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 $cm^2$ IC chip having feature sizes around of about 90 nm can comprise hundreds of millions of components. Current technologies are pushing feature sizes even smaller than 45 nm.

Components of IC chips include solid-state logic devices (transistors) such as CMOS (complementary metal-oxide-semiconductor) devices. Generally, computing devices associate a computational state (information) with electronic charge. Logic operations within the computing device are then performed by manipulating, detecting, and storing electronic charges.

BRIEF DESCRIPTION OF THE FIGURES

FIGS. 3A-C show methods for forming transistor gates having silicon dioxide gate dielectric regions.

FIGS. 4A-B describe additional methods for forming silicon dioxide transistor gate dielectric regions.

DETAILED DESCRIPTION OF THE INVENTION

Embodiments of the present invention provide devices housing a plurality of different types of transistors having different composite gate dielectric stacks and methods for manufacturing these devices. The formation of devices having a plurality of transistor types can address divergent circuit requirements, such as for example, high speed logic operation, low power usage, high voltage input output (I/O), and extremely high voltage, which are desirable attributes for components of system-on-a-chip (SOC) integrated circuits. System-on-a-chip devices integrate a wide variety of circuit functions such as, processor cores, analog functions, and mixed signal blocks onto a single integrated circuit chip. Embodiments of the invention provide devices and methods of forming devices comprised of different types of transistors having two or three high-k gate dielectric thicknesses, one or two silicon oxide ($SiO_2$) thicknesses, and gate dielectric combinations thereof. Transistors having varied gate dielectrics are capable of providing performance characteristics that span a wide range of operating speeds, leakage characteristics, and high voltage tolerances.

Figure 1A:
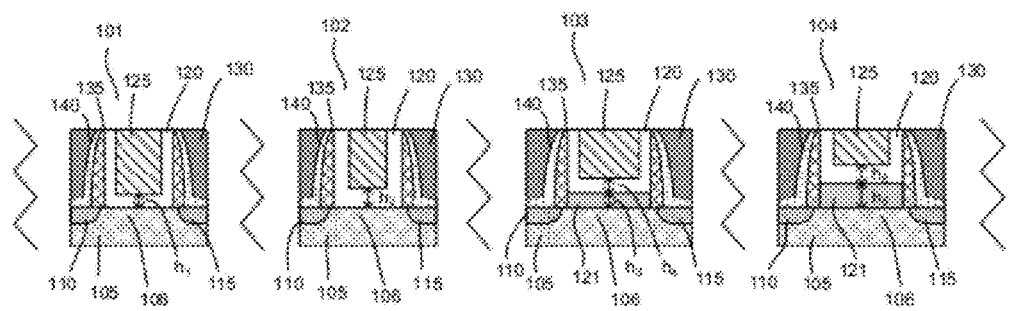
FIGS. 1A-C illustrate integrated circuit devices having at least four different types of transistors that are distinguished by the thickness and composition of the gate dielectric employed.

FIG. 1A illustrates transistors located in an integrated circuit device. The integrated circuit device has at least four different transistors, 101, 102, 103, and 104 that are distinguished at least by the thickness and composition of the gate dielectric employed. Transistors 101, 102, 103, and 104 may have other distinguishing features. Typically a device having a plurality of different transistors will have a large number of instances of each type of transistor arranged in various formats (e.g., arrays). For simplicity, one instance of each type of transistor 101, 102, 103, and 104 is shown in FIG. 1A as an isolated transistor, although the transistors illustrated 101, 102, 103, and 104 are typically found in various places and arrangements in the integrated circuit chip in which they are located.

In FIG. 1A, a semiconductor substrate 105 has sources 110 and drains 115 associated with the proximate transistor gate structures. Other shapes and sizes for the source 110 and drain 115 are possible. The channel region 106 proximate to the gate dielectric and between the source 110 and the drain 115 can be a p-type channel or an n-type channel. The transistor gate structures include high-k dielectric layers 120 having heights $h_1$, $h_2$, $h_4$, and $h_6$ (as shown in FIG. 1A) that correspond to the thickness of the high-k layer between the gate electrode 125 and the channel region 106 of the substrate 105. The first height $h_1$ is less than the second height $h_2$. In some embodiments, the fourth height, $h_4$, is less than the sixth height, $h_6$. In some embodiments, the fourth height, $h_4$, and the sixth height, $h_6$, are the same. In some embodiments, the fourth height, $h_4$, is the same as the first height, $h_1$, and or the sixth height, $h_6$, is the same as the first height, $h_1$, or the second height, $h_2$.

Transistors 103 and 104 additionally include $SiO_2$ layers 121 in the gate dielectric structure. Oxide layers 121 have associated heights, $h_3$ and $h_5$, that correspond to the thickness of the $SiO_2$ layer between the gate electrode 125 and the channel region 106 of the substrate 105. The third height, $h_3$, is less than the fifth height, $h_5$.

A range of values for $h_1$, $h_2$, $h_4$, and $h_6$ is 1 nm to 10 nm. In embodiments of the invention, the range of values for $h_1$, $h_2$, $h_4$, and $h_6$ is 1 nm to 4 nm. A range of values for $h_3$ and $h_5$ (a silicon dioxide dielectric layer) is 1 nm to 11 nm. In embodiments of the invention, the range of values for $h_3$ and $h_5$ is 1 nm to 6 nm. In embodiments of the invention $h_5$ is larger than $h_3$ by an amount that is from 1 nm to 3 nm.

Typically, transistor structures 101, 102, 103, and 104 are at least partially surrounded by a dielectric material 130, which in some embodiments is an interlayer dielectric (ILD) material. Posts or spacers 135 are located on sides of the transistor gate. Spacers 135 are comprised of a dielectric material, such as for example, silicon nitride, silicon dioxide, silicon oxynitride, or other material known in the semiconductor art. One or more layers of a dielectric material 140 (an etch stop layer, for example) may be located between the spacers 135 and the dielectric layer 130. The dielectric layer(s) 140 are comprised, for example, of silicon nitride, silicon oxynitride, silicon carbide, or other material known in the art.

Figure 1B:
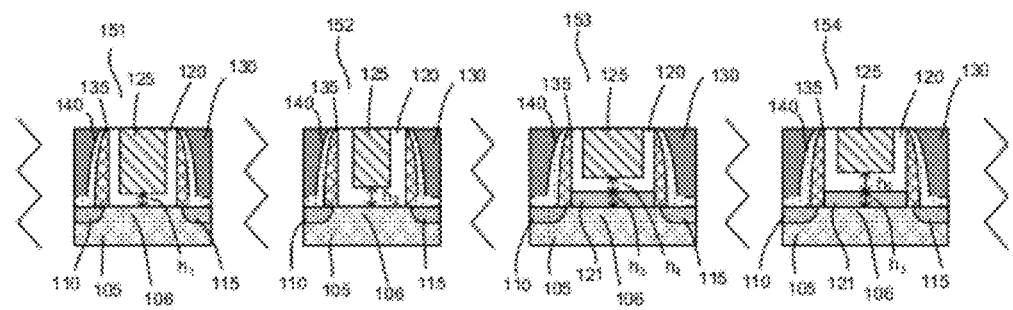

FIG. 1B illustrates transistors located in an integrated circuit device. The integrated circuit device has at least four different transistors, 151, 152, 153, and 154 that are distinguished at least by the thickness and composition of the gate dielectric employed. Transistors 151, 152, 153, and 154 may have other distinguishing features. Typically a device having a plurality of different transistors will have a large number of instances of each type of transistor arranged in various formats (e.g., arrays). For simplicity, one instance of each type of transistor 151, 152, 153, and 154 is shown in FIG. 1B as an isolated transistor, although the transistors illustrated 151, 152, 153, and 154 are typically found in various places and arrangements in the integrated circuit chip in which they are located. Elements of transistors 151, 152, 153, and 154 in FIG. 1B are the same as the elements of transistor structures 101, 102, 103, and 104 in FIG. 1A, except as discussed below.

In FIG. 1B, the transistor gate structures include high-k dielectric layers 120 having heights $h_1$, $h_2$, $h_4$, and $h_5$ that correspond to the thickness of the high-k layer between the gate electrode 125 and the channel region 106 of the substrate 105. The first height, $h_1$, is less than the second height, $h_2$. The fourth height, $h_4$, is less than the fifth height, $h_5$. In some embodiments, the fourth height, $h_4$, is the same as the first height, $h_1$, and or the fifth height, $h_5$, is the same as the second height, $h_2$. A range of values for $h_1$, $h_2$, $h_4$, and $h_5$ is 1 nm to 10 nm. In embodiments of the invention, the range of values for $h_1$, $h_2$, $h_4$, and $h_6$ is 1 nm to 4 nm. Differences between heights is in the nanometer range.

Transistors 153 and 154 additionally include $SiO_2$ layers 121 in the gate dielectric structure. Oxide layers 121 have an associated height, $h_3$, which corresponds to the thickness of the $SiO_2$ layer 121 between the gate electrode 125 and the channel region 106 of the substrate 105. A range of heights, $h_3$, for the silicon dioxide dielectric layer 121 is 1 nm to 10 nm. In embodiments of the invention, the range of thicknesses is between 2 nm and 6 nm.

Figure 1C:
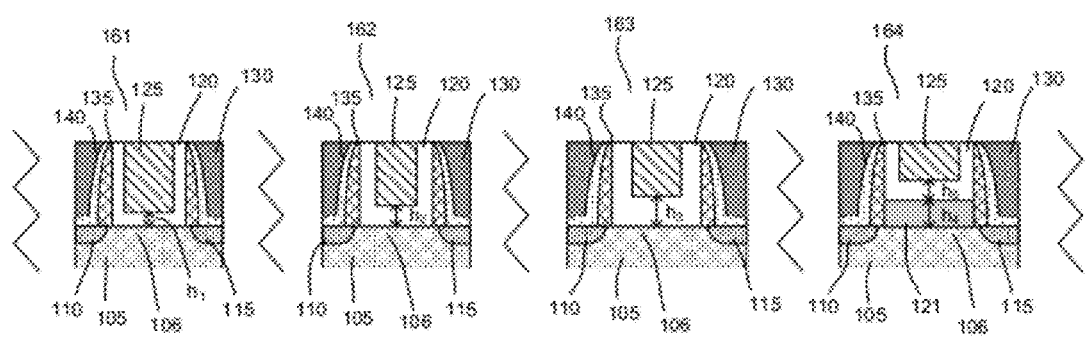

FIG. 1C illustrates transistors located in an integrated circuit device. The integrated circuit device has at least four different transistors, 161, 162, 163, and 164 that are distinguished at least by the thickness and composition of the gate dielectric employed. Transistors 161, 162, 163, and 164 may have other distinguishing features. Typically a device having a plurality of different transistors will have a large number of instances of each type of transistor arranged in various formats (e.g., arrays). For simplicity, one instance of each type of transistor 161, 162, 163, and 164 is shown in FIG. 1C as an isolated transistor, although the transistors illustrated 161, 162, 163, and 164 are typically found in various places and arrangements in the integrated circuit chip in which they are located. Elements of transistors 161, 162, 163, and 164 in FIG. 1C are the same as the elements of transistor structures 101, 102, 103, and 104 in FIG. 1A, except as discussed below.

In FIG. 1C, the transistor gate structures include high-k dielectric layers 120 having heights $h_1$, $h_2$, $h_3$, and $h_5$ that represent the thickness of the high-k layer between the gate electrode 125 and the channel region 106 of the substrate 105. The first height $h_1$ is less than the second height $h_2$. The third height, $h_3$, is greater than both the first height, $h_1$, and the second height, $h_2$. In embodiments of the invention, the fifth height, $h_5$, is the same as the height $h_1$, $h_2$, or $h_3$. A range of values for $h_1$, $h_2$, $h_3$ and $h_5$ is 1 nm to 10 nm. In embodiments of the invention, the range of values for $h_1$, $h_2$, $h_3$, and $h_5$ is 1 nm to 4 nm. Differences between heights is in the nanometer range.

Transistor 164 additionally includes a $SiO_2$ layer 121 in the gate dielectric structure. Oxide layer 121 has an associated height, $h_4$ that corresponds to the thickness of the $SiO_2$ layer 121 between the gate electrode 125 and the channel region 106 of the substrate 105. A range of heights, $h_4$, for the silicon dioxide dielectric layer 121 is 1 nm to 11 nm. In embodiments of the invention, the range of values for $h_3$ and $h_5$ is 1 nm to 6 nm or 2 nm to 5 nm.

Figure 2A:
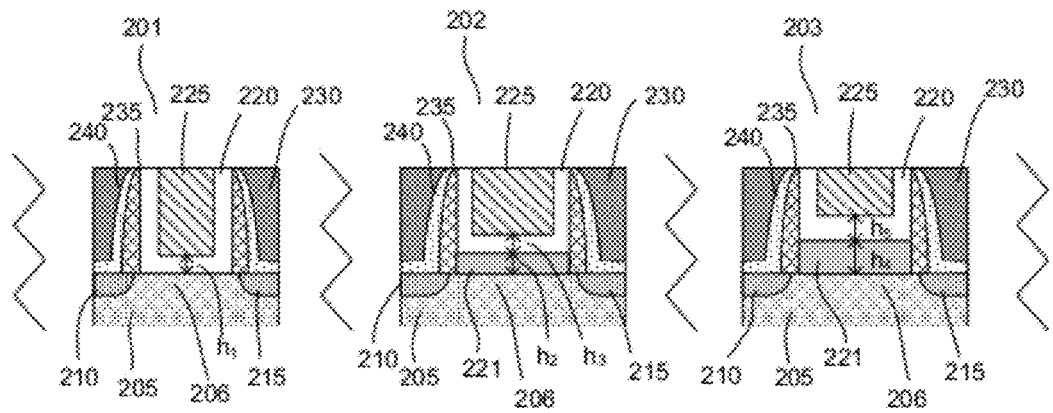
FIGS. 2A-C show integrated circuit devices having at least three different types of transistors that are distinguished by the thickness and composition of the gate dielectric employed.

FIG. 2A illustrates transistors located in an integrated circuit device. The integrated circuit device has at least three different types of transistors, 201, 202, and 203 that are distinguished at least by the thickness and composition of the gate dielectric employed. Transistors 201, 202, and 203 may have other distinguishing features. Typically a device having a plurality of different transistors will have a large number of instances of each type of transistor arranged in various formats (e.g., arrays). For simplicity, one instance of each type of transistor 201, 202, and 203 is shown in FIG. 2A as an isolated transistor, although the transistors illustrated 201, 202, and 203 are typically found in various places and arrangements in the integrated circuit chip in which they are located.

In FIG. 2A, a semiconductor substrate 205 has sources 210 and drains 215 associated with the proximate transistor gate structures. Other shapes and sizes for the sources 110 and drains 115 are possible. The channel region 206 proximate to the gate dielectric and between a source 210 and a drain 115 can be a p-type channel or an n-type channel. The transistor gate structures include high-k dielectric layers 220 having heights $h_1$, $h_3$, and $h_5$ (as shown in FIG. 2A) that correspond to the thickness of the high-k layer between the gate electrode 225 and the channel region 206 of the substrate 205. In embodiments of the invention, heights $h_1$, $h_3$, and $h_5$ are not all the same value. In other embodiments of the invention two of the three heights, $h_1$, $h_3$, and $h_5$, are the same. In embodiments of the invention, the first height $h_1$ is less than the fifth height, $h_5$. In some embodiments, the first height, $h_1$, is the same as the third height, $h_3$, and both $h_1$ and $h_3$ are less than the fifth height, $h_5$. A range of values for $h_1$, $h_3$, and $h_5$ is 1 nm to 10 nm. In embodiments of the invention, the range of values for $h_1$, $h_3$, and $h_5$ is 1 nm to 4 nm. Differences between heights is in the nanometer range.

Transistors 202 and 203 additionally include $SiO_2$ layers 221 in the gate dielectric structure. Oxide layers 221 have associated heights, $h_2$ and $h_4$, which correspond to the thickness of the $SiO_2$ layer between the gate electrode 225 and the channel region 206 of the substrate 205. In embodiments of the invention, the second height, $h_2$ is less than the fourth height, $h_4$. In other embodiments, $h_2$ and $h_4$ are equal and $h_1$, $h_3$, and $h_5$ are not equal. A range of values for $h_2$ and $h_4$ is 1 nm to 11 nm. In embodiments of the invention, the range of values for $h_2$ and $h_4$ is 1 nm to 6 nm or 2 nm to 5 nm. Differences between heights is in the nanometer range.

Typically, transistor structures 201, 202, 203 are at least partially surrounded by a dielectric material 230, which in some embodiments is an interlayer dielectric (ILD) material. Posts or spacers 235 are located on sides of the transistor gate. Spacers 235 are comprised of a dielectric material, such as for example, silicon nitride, silicon dioxide, silicon oxynitride, or other material known in the art. One or more layers of a dielectric material 240 (an etch stop material, for example) may be located between the spacers 235 and the dielectric layer 230. The dielectric layer(s) 240 are comprised, for example, of silicon nitride, silicon oxynitride, silicon carbide, or other material known in the art.

Figure 2B:
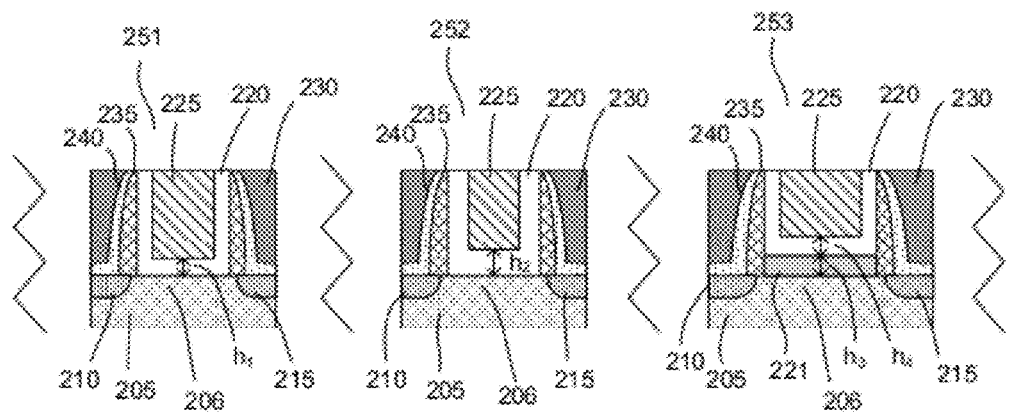

FIG. 2B illustrates transistors located in an integrated circuit device. The integrated circuit device has at least three different types of transistors, 251, 252, and 253 that are distinguished at least by the thickness and composition of the gate dielectric employed. Transistors 251, 252, and 253 may have other distinguishing features. Typically a device having a plurality of different transistors will have a large number of instances of each type of transistor arranged in various formats (e.g., arrays). For simplicity, one instance of each type of transistor 251, 252, and 253 is shown in FIG. 2B as an isolated transistor, although the transistors illustrated 251, 252, and 253 are typically found in various places and arrangements in the integrated circuit chip in which they are located. Elements of transistors 251, 252, and 253 in FIG. 2B are the same as the elements of transistor structures 201, 202, and 203 in FIG. 2A, except as discussed below.

In FIG. 2B, the transistor gate structures include high-k dielectric layers 220 having heights $h_1$, $h_2$, and $h_4$ that correspond to the thickness of the high-k layer between the gate electrode 225 and the channel region 206 of the substrate 205. The second height $h_2$ is greater than the first height, $h_1$. In embodiments of the invention $h_4$ is the same as either $h_1$ or $h_2$. A range of values for $h_1$, $h_2$, and $h_4$ is 1 nm to 10 nm. In embodiments of the invention, the range of values for $h_1$, $h_2$, and $h_4$ is 1 nm to 4 nm. Differences between heights is in the nanometer range.

Transistor 253 additionally includes a $SiO_2$ layer 221 in the gate dielectric structure. Oxide layer 221 has associated height, $h_3$, which corresponds to the thickness of the $SiO_2$ layer between the gate electrode 225 and the channel region 206 of the substrate 205. A range of values for $h_3$ is 1 nm to 11 nm. In embodiments of the invention, the range of values for $h_3$ 1 nm to 6 nm or 2 nm to 5 nm.

Figure 2C:
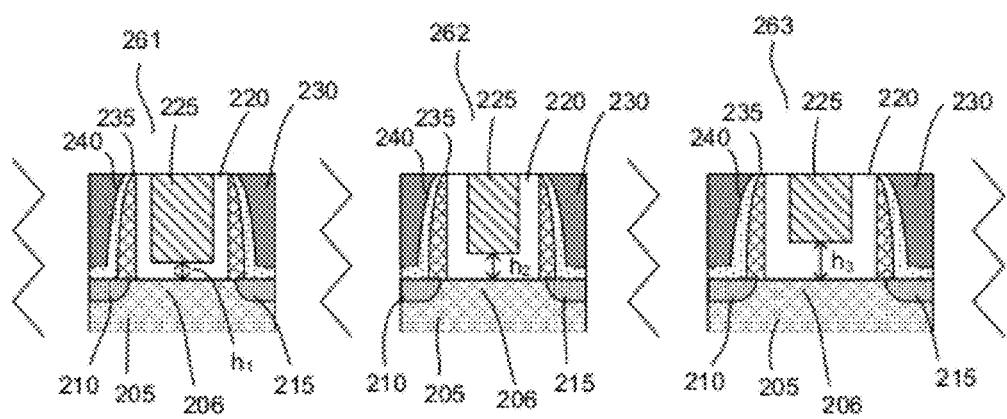

FIG. 2C illustrates transistors located in an integrated circuit device. The integrated circuit device has at least three different types of transistors, 261, 262, and 263 that are distinguished at least by the thickness and composition of the gate dielectric employed. Transistors 261, 262, and 263 may have other distinguishing features. Typically a device having a plurality of different transistors will have a large number of instances of each type of transistor arranged in various formats (e.g., arrays). For simplicity, one instance of each type of transistor 261, 262, and 263 is shown in FIG. 2C as an isolated transistor, although the transistors illustrated 261, 262, and 263 are typically found in various places and arrangements in the integrated circuit chip in which they are located. Elements of transistors 261, 262, and 263 in FIG. 2C are the same as the elements of transistor structures 201, 202, and 203 in FIG. 2A, except as discussed below.

In FIG. 2C, the transistor gate structures include high-k dielectric layers 220 having heights $h_1$, $h_2$, and $h_3$ that correspond to the thickness of the high-k layer between the gate electrode 225 and the channel region 206 of the substrate 205. The first height, $h_1$, is different from the second height, $h_2$, and the third height, $h_3$, is different from the first and second heights, $h_1$ and $h_2$. A range of values for $h_1$, $h_2$, and $h_3$ is 1 nm to 11 nm. In embodiments of the invention, the range of values for $h_1$, $h_2$, and $h_3$ is 1 nm to 4 nm. Differences between heights is in the nanometer range.

With respect to the previously described embodiments, it should be noted that it is also possible to vary characteristics such as the width of the gate, the width of the channel region, the types of sources and drains used, among other device characteristics, as is understood by those of skill in the art.

In general, a high-k dielectric is a dielectric material having a dielectric constant greater than that of $SiO_2$. The dielectric constant of $SiO_2$ is 3.9. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum oxide, barium strontium titanium oxide, barium titanium oxide, strontium titanium oxide, yttrium oxide, aluminum oxide, lead scandium tantalum oxide, lead zinc niobate, and other materials known in the semiconductor art.

Materials that can comprise the gate electrode include, for example, metal gate materials, such as, hafnium, zirconium, titanium, TiN, tantalum, aluminum, and combinations thereof. Additional materials include, metal carbides, such as, for example, titanium carbide, zirconium carbide, tantalum carbide, hafnium carbide and aluminum carbide. Further materials that are used include ruthenium, palladium, platinum, cobalt, nickel, and conductive metal oxides, such as, for example, ruthenium oxide. Other materials are possible.

Typical dielectric materials used for dielectric layers, features, and or interlayer dielectrics (ILD) include silicon dioxide and low-k dielectric materials. Additional dielectric materials that may be used include, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer may include pores to further reduce the dielectric constant.

In manufactured devices, layers of materials can deviate in appearance from the simplified illustrations provided herein for clarity, and can be, for example, slightly thicker or thinner in areas. Additionally, what is described here as a "layer" of material may be made up of a plurality of layers of the material that essentially function as one layer.

Figure 3C:
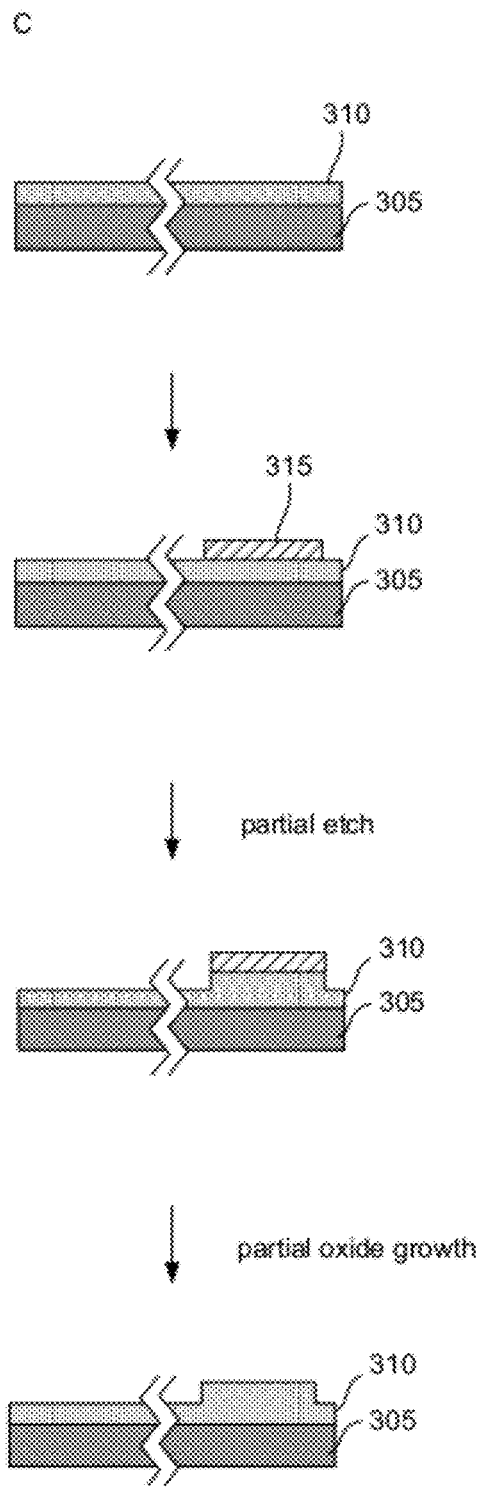

FIGS. 3A-C describe methods for the formation of transistor gates comprised of $SiO_2$ gate dielectric material. The methods of FIGS. 3A-C are useful for forming integrated circuit devices comprising different types of transistors that have either three or four different gate dielectric structures. In FIG. 3A, a substrate 305 having a $SiO_2$ layer 310 on a surface is provided. A photoresist material is deposited on the substrate 305. The photoresist is photolithographically patterned so that the photoresist 315 covers the area in which a transistor gate having a thicker $SiO_2$ gate is to be formed. The silicon dioxide layer 310 is etched from the surface of the substrate in the areas that are not covered by the photoresist 315 and the photoresist 315 is removed. Silicon dioxide is then grown on the substrate 305 creating regions on the substrate 305 comprising two different thicknesses of silicon dioxide 310. The silicon dioxide tends to grow faster in areas in which there is not already existing oxide.

In FIG. 3B, a substrate 305 having a $SiO_2$ layer 310 on a surface is provided. A photoresist material is deposited on the substrate 305. The photoresist is photolithographically patterned so that the photoresist 315 covers the area in which a transistor gate having a thicker $SiO_2$ gate is to be formed. The silicon dioxide layer 310 is partially etched from the surface of the substrate in the areas that are not covered by the photoresist 315 and the photoresist 315 is removed. The resulting substrate 305 has regions comprising two different thicknesses of silicon dioxide 310.

In FIG. 3C, a substrate 305 having a $SiO_2$ layer 310 on a surface is provided. A photoresist material is deposited on the substrate 305. The photoresist is photolithographically patterned so that the photoresist 315 covers the area in which a transistor gate having a thicker $SiO_2$ gate is to be formed. The silicon dioxide layer 310 is partially etched from the surface of the substrate in the areas that are not covered by the photoresist 315 and the photoresist 315 is removed. A partial layer of silicon dioxide is then grown on the substrate 305 creating regions on the substrate 305 comprising two different thicknesses of silicon dioxide 310.

FIGS. 4A-B provide additional methods for forming transistor gates comprised of $SiO_2$. The methods of FIGS. 4A-B are useful for forming integrated circuit devices comprising different types of transistors that have either three or four different gate dielectric structures. In FIG. 4A, a substrate 305 is provided and a photoresist material is deposited and lithographically patterned to create photoresist layer 315. An ion implant process implants ions into the substrate 305 in the regions of the substrate 305 that are not masked by the photoresist layer 315. The species implanted is a species that once implanted enhances the oxidation rate of Si, for example, an inert species or a Group IV element, such as, Ar, O, As, Ge, or Si, or other species known in the art. The ion implant process forms implant region 320. The photoresist 315 is removed and silicon dioxide 310 is grown on the substrate surface. The silicon dioxide 310 growth rate is enhanced in the area in which ions have been implanted into the substrate and two different thicknesses of silicon dioxide 310 are produced. The two different thicknesses of silicon dioxide form two different gates for transistors after additional processing.

In FIG. 4B, a substrate 305 has silicon dioxide layer 310. A photoresist is deposited and patterned, creating patterned photoresist 315. An ion implant process implants ions into the silicon dioxide layer 310 in the regions where the oxide layer 310 is not masked by the photoresist layer 315. The ion implant process forms implant region 325. The species implanted is a species that once implanted enhances the etch rate of $SiO_2$, for example, carbon or a heavy ion, or species known in the art. The photoresist 315 is removed and the silicon dioxide layer 310 is etched. The silicon dioxide 310 etch rate is enhanced in the area in which ions have been implanted into the silicon dioxide layer 325 and two different thicknesses of silicon dioxide are produced. The two different thicknesses of silicon dioxide form two different gates for transistors after additional processing.

Figure 5A:
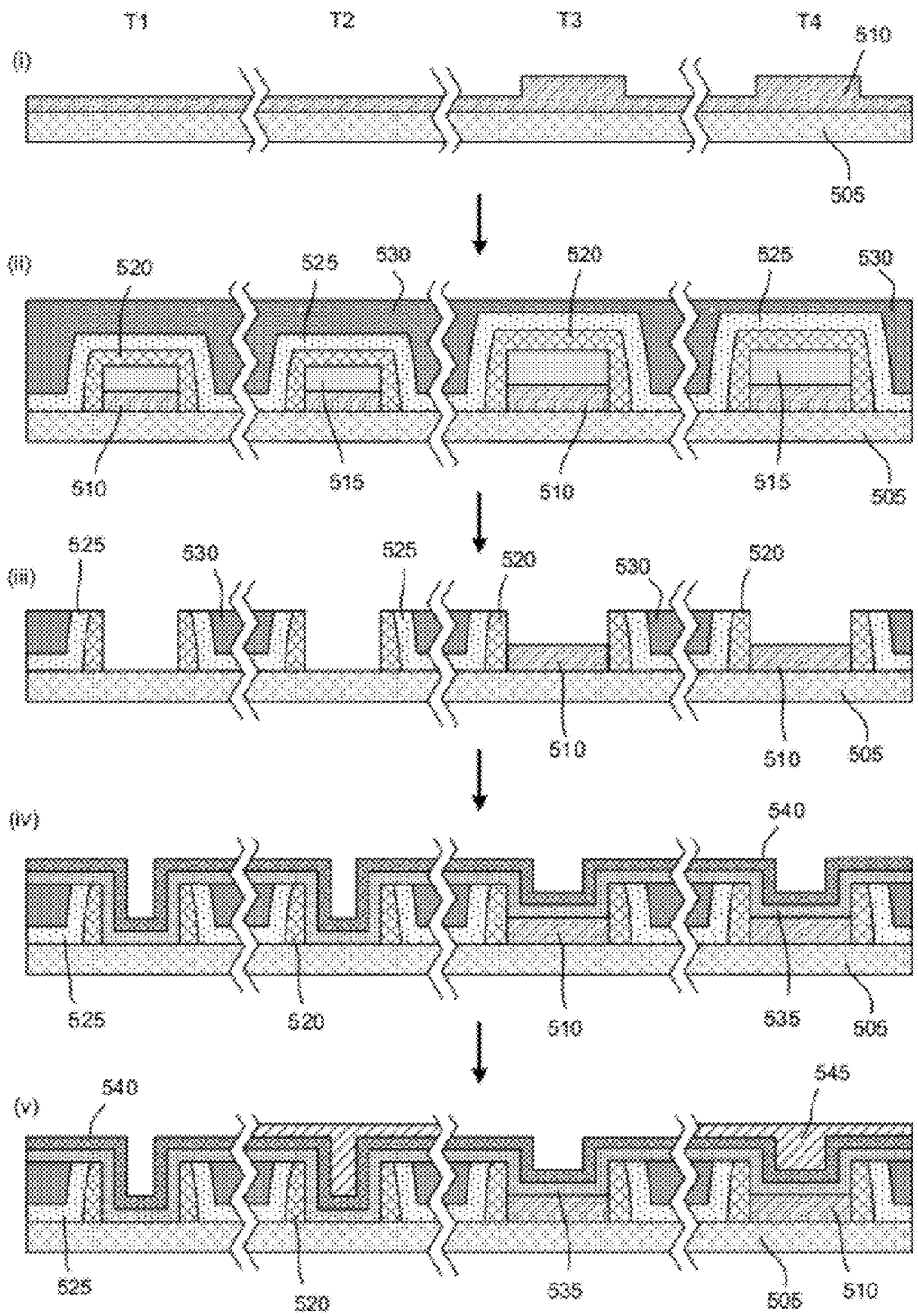
FIGS. 5A-B illustrate a process for the formation of four different types of transistors on a substrate.
Figure 5B:
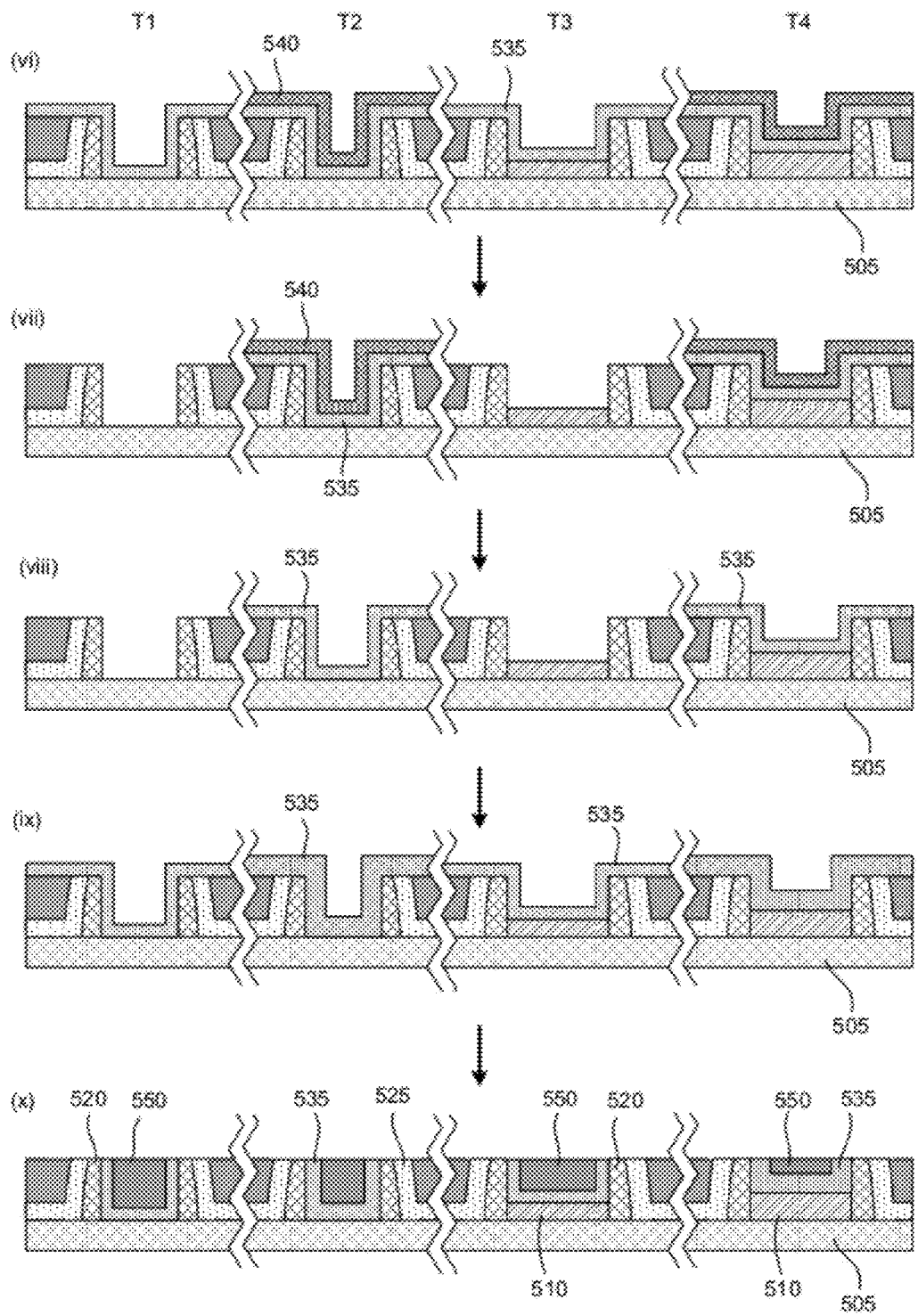

FIGS. 5A-B illustrate the formation of four different types of transistors on a substrate surface. The transistor regions in FIGS. 5A and 5B are labeled T1, T2, T3, and T4. Transistors T1 and T2 have, at the end of the process, high-k dielectric gates of different thicknesses, and transistors T3 and T4 have different composite $SiO_2$ and high-k dielectric gates. An integrated circuit chip typically comprises multiple copies of the same transistor in various locations, however, one of each type of transistor is shown in FIGS. 5A-B for clarity.

In FIG. 5A, a substrate 505 has a silicon dioxide layer 510 having two regions of different thicknesses. In the structure labeled (i) in FIG. 5A, a substrate 505 having a silicon dioxide layer 510 having two regions of different thicknesses is formed, for example, according to the methods described with respect to FIGS. 3A-C or FIGS. 4A-B. The substrate 505 comprises a source and a drain (not shown) for each transistor region. In embodiments of the invention, the substrate is a silicon substrate. In the structure labeled (ii), structural components for four different transistors have been formed on the substrate 505. Methods for forming structure (ii) are known in the art of semiconductor manufacturing. In FIG. 5A(ii), the gate regions of the transistors comprise a polysilicon region 515 and a silicon dioxide region 510. The structure in FIG. 5A(ii) additionally comprises a spacer layer 520, a first dielectric layer 525, and a second dielectric layer 530. The spacer layer 520 and the first dielectric layer 525 are comprised, for example, of silicon nitride. The second dielectric layer 530 is, for example, an interlayer dielectric, comprising a dielectric material, such as, for example, $SiO_2$, silicon nitride, or a low-k dielectric material.

In FIG. 5A, structure (ii) is then given a chemical mechanical polish, removing material down to the polysilicon layer 515 so that the polysilicon layer 515 is exposed. The polysilicon layer 515 is removed using a wet or dry etch process and the surface of the structure is cleaned yielding structure (iii). A further wet etch process partially removes the silicon dioxide 510 in the gate regions of the transistors, so that transistors T1 and T2 no longer have $SiO_2$ in the gate region. The wet etch comprises, for example, HF. Structure (iii) additionally comprises a spacer layer 520, a first dielectric layer 525, and a second dielectric layer 530, as from structure (iii), but having been modified in shape by the polish process.

A high-k film 535 and a hard mask 540 are then deposited creating the structure illustrated in FIG. 5A (iv). The high-k dielectric material 535 is deposited for example, by chemical vapor deposition (CVD), atomic layer deposition (ALD), metal organic chemical vapor deposition (MOCVD), or physical vapor deposition (PVD). The hard mask 535 comprises, for example, an organic or an inorganic hard mask material, such as for example, SiC, $SiO_2$, SiON, TiN, carbon, or other material known in the art.

A photoresist layer 545 is deposited and patterned providing structure (v) of FIG. 5A. In FIG. 5B, structure (vi), the hard mask 540 is etched away in regions not covered by the photoresist exposing the underlying high-k dielectric material 535. The hard mask 540 is etched with either a dry etch or a wet etch process. The hard mask 535 is removed, for example, using a wet or dry etch. The exposed high-k dielectric 535 is the etched to provide structure (vii). High-k dielectric layers are etched, for example, using a dry etch. The remaining hard mask 540 is then etched away yielding structure (viii) having a high-k dielectric layer in transistor regions T2 and T4. The hard mask is selectively etched away, using, for example, a wet etch, for embodiments in which the hard mask is resistant to a wet etch.

A layer of low-k dielectric is deposited on the surface of structure (viii) yielding structure (ix). In structure (ix), transistor regions T1 and T3 have thinner layers of low-k dielectric 535 than transistor regions T2 and T4. In alternate embodiments, devices having transistors having three different thicknesses of low-k dielectric material are formed in a method that is similar to the method associated with structures (iv) through (ix). In this alternate embodiment, transistor regions T2-T4 are masked, the low-k dielectric is etched from transistor region T1 (for example, although a different transistor region could be chosen), and an additional layer of low-k dielectric is deposited, yielding three regions having different thicknesses of low-k dielectric. In this embodiment, it is also possible to begin the method of FIGS. 5A-B with a substrate having a thicker region of $SiO_2$ associated with transistor T4 and thinner regions associated with transistors T1-T3, so that the resulting device has three different transistors that do not have $SiO_2$ layers in the gate dielectric regions. Other similar modifications to the method are possible to produce transistors having desired gate dielectric regions as can be understood by one of skill in the art, such as, for example, beginning the process without a $SiO_2$ layer, in order to produce a device having three different types of transistors each of which has a gate dielectric region having a different thickness of low-k dielectric.

The metal of the metal gate 550 is deposited and the surface is given a chemical-mechanical polish forming structure (x). In structure (x), substrate 505 comprises a source and a drain region (not shown) proximate to each transistor, and the transistors T1 and T2 comprise a low-k dielectric layer 535 in which the low-k dielectric layer of T1 is less thick than the low-k dielectric layer of T2. Transistors T3 and T4 comprise a $SiO_2$ layer 510 and the $SiO_2$ layer 510 of transistor T3 is less thick than the $SiO_2$ layer of transistor T4. Other configurations are possible for the dielectric layers that make up the gate regions of the transistors and can be achieved by modifications to the described procedures which are capable of being made by one of skill in the art.

Figure 6:
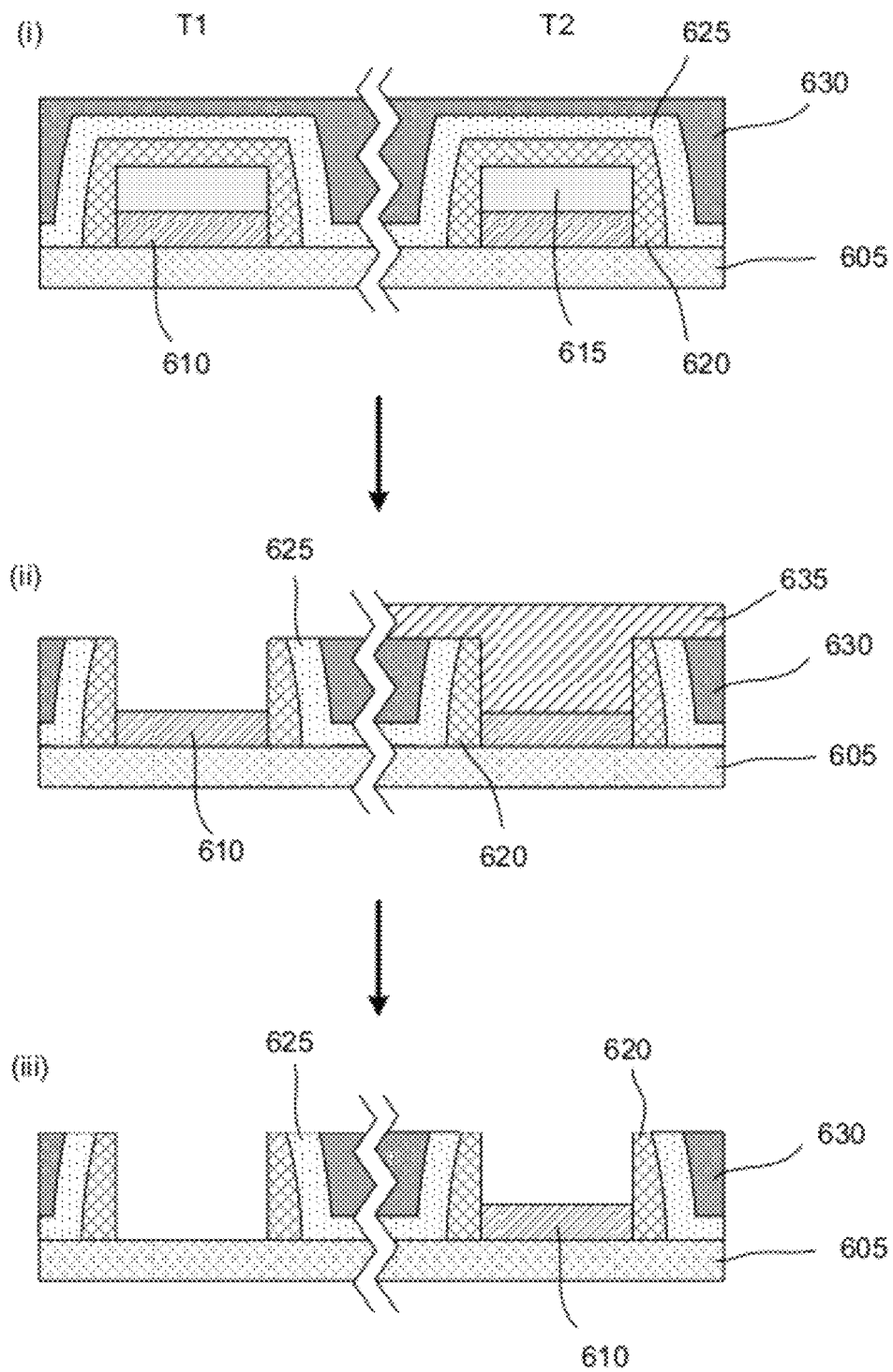
FIG. 6 illustrates a method for forming two different $SiO_2$ transistor gate thicknesses.

FIG. 6 provides and additional method for forming a device having transistor regions T2 and T2 with different gate $SiO_2$ layer thicknesses. In FIG. 6, a polysilicon gate structure (i) is formed. The polysilicon gate structure (i) comprises a substrate 605 having an associated proximate source and drain (not shown) for each transistor gate. The polysilicon gate structure (i) additionally comprises $SiO_2$ gate dielectric layer 610, a polysilicon gate region 615, a first dielectric spacer layer 620, a second dielectric layer 625, and a third dielectric layer 630. The third dielectric layer 630 is, for example, an interlayer dielectric layer (ILD). The polysilicon gate structure (i) is chemically mechanically polished exposing the polysilicon layer, the polysilicon is etched away, and a photoresist layer 635 (or other masking layer) is deposited and patterned, yielding structure (ii). The polysilicon layer is etched out, for example, using a combination of a wet and dry etch. The exposed $SiO_2$ gate material 610 is then etched away and the photoresist layer 635 is removed yielding structure (iii). The $SiO_2$ gate material 610 is etched using, for example, a HF etchant. Structure (iii) of FIG. 6 is usable, for example, in the method of FIGS. 5A-B, such that structure (iii) of FIG. 6 is usable as structure (iii) of FIG. 5A.

Figure 7A:
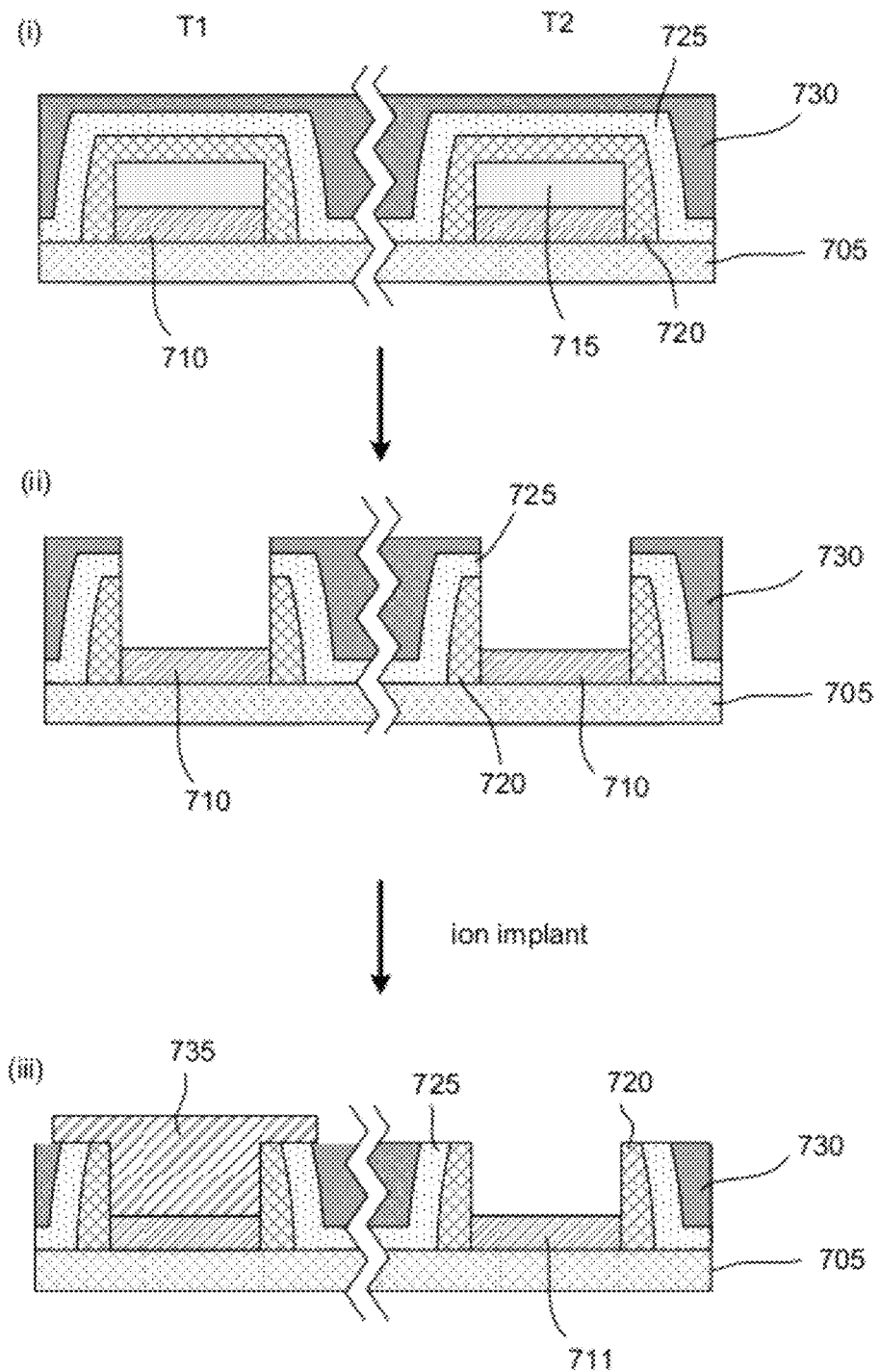
FIGS. 7A-B show a method for forming transistors on a substrate having two different $SiO_2$ gate thicknesses.
Figure 7B:
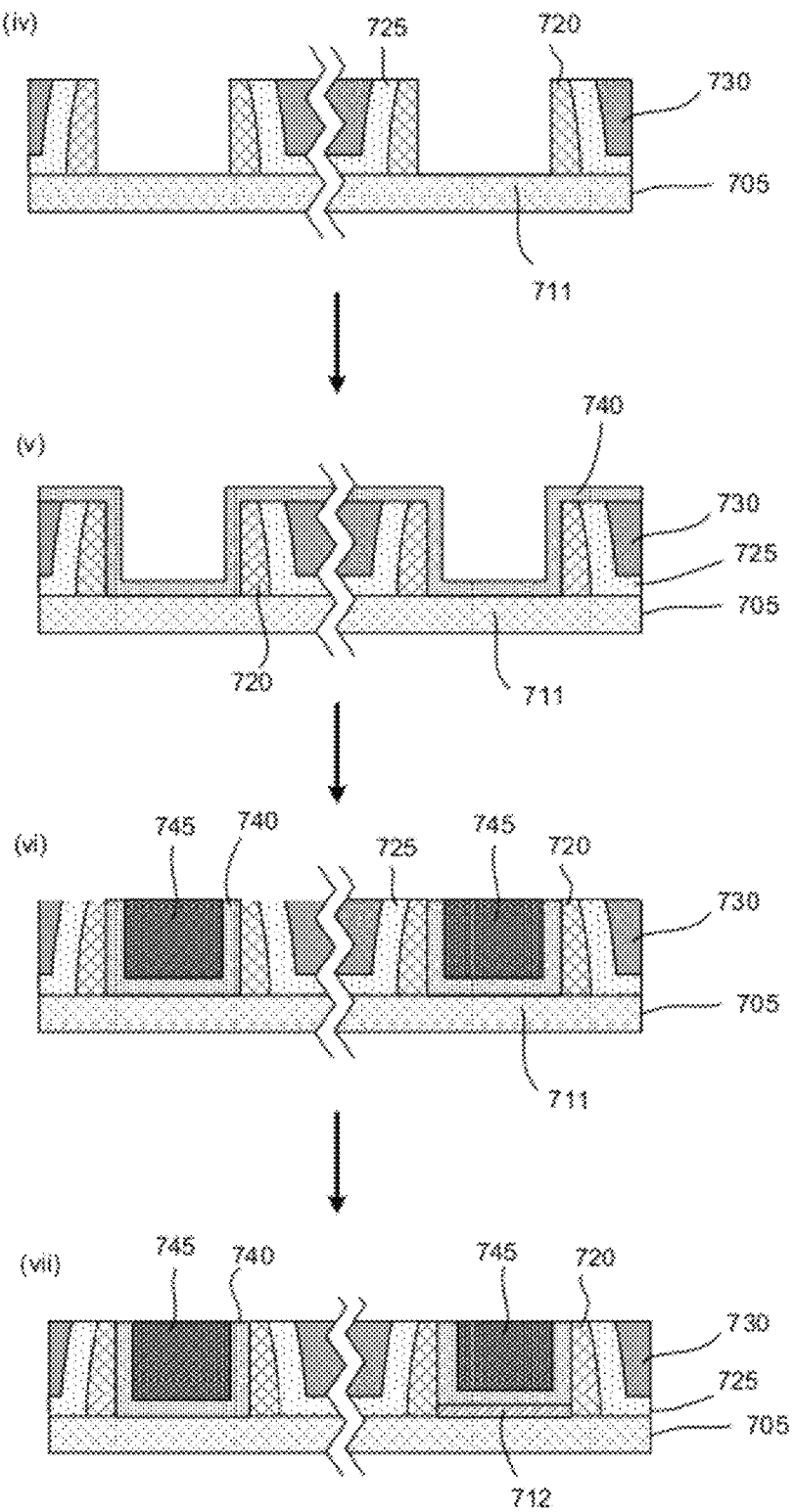

FIGS. 7A-B illustrate a method for forming transistors having gate dielectric structures comprising two different thicknesses of $SiO_2$ and a high-k dielectric layer. In FIG. 7A, a polysilicon gate structure (i) is formed. The polysilicon gate structure (i) comprises a substrate 705 having an associated proximate source and drain (not shown) for each transistor gate. The polysilicon gate structure (i) additionally comprises a $SiO_2$ gate dielectric layer 710, a polysilicon gate region 715, a first dielectric spacer layer 720, a second dielectric layer 725, and a third dielectric layer 730. The third dielectric layer 730 is, for example, an interlayer dielectric layer. The polysilicon gate structure (i) is chemically mechanically polished exposing the polysilicon layer and the polysilicon is etched away yielding structure (ii). The polysilicon layer is etched out, for example, using a combination of a wet and dry etch. A photoresist layer 735 is deposited and patterned and an ion implant process is used to implant ions into a $SiO_2$ layer 710 of one of the two gate regions (in this case, T2) yielding structure (iii) having implant region 711. The species implanted are, for example, Si, O, N, or C. It is also possible to use other species, as understood in the art. The patterned photoresist 735 is removed and the $SiO_2$ layer is removed from the gate regions with an HF etch, yielding structure (iv) having implant region 711. A low-k dielectric layer 740 is deposited yielding structure (v). A metal gate 745 is deposited and the structure is chemically and mechanically polished yielding structure (vi) of FIG. 7B. After annealing, structure (v) is formed having two different gate regions, T1 and T2, in which T1 has a low-k dielectric gate region, and T2 has both a low-k dielectric 740 gate region and a $SiO_2$ dielectric gate region 712. The $SiO_2$ gate region 712 is formed through the interaction of the high-k gate region 712 with the implanted region 711 of the substrate 705. The process of FIGS. 7A-B is compatible with integration into the process of FIGS. 5A-B in which a device having transistors with different thicknesses of low-k dielectric and $SiO_2$ in the transistor gate regions is formed. Structure (iv) of FIG. 7B is used for structure (iii) of FIG. 5A. Annealing of structure (x) of FIG. 5B forms a $SiO_2$ region.

In general, photoresists are removed by processes used in the semiconductor industry. Photoresists can be removed, for example, through dry plasma processes. The resist is removed in an oxygen plasma in processes, frequently called ashing, which is designed to remove organic residues. The plasma is generated, for example, by microwave, rf (radio frequency), or UV-ozone sources. Alternately, the photoresist can be removed using a solvent or mixture of solvents.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and/or structures may be included and/or described features may be omitted in other embodiments.

We claim:

1. A device comprising,
   at least four different types of transistors on a substrate, wherein the transistors each comprise a gate structure,
   wherein the gate structure of a first transistor comprises a first gate dielectric layer comprising a first high-k dielectric layer having a first thickness, the gate structure of a second transistor comprises a second gate dielectric layer comprising a second high-k dielectric layer having a second thickness, wherein the first and the second high-k dielectric layer thicknesses are not the same,
   wherein the gate structure of a third transistor comprises a third gate dielectric layer comprising a first silicon dioxide layer having a third thickness, the gate structure of a fourth transistor comprises a fourth gate dielectric layer comprising a second silicon dioxide layer having a fourth thickness, wherein the third and the fourth silicon dioxide layer thicknesses are not the same, and
   wherein the gate structure of each of the transistors additionally comprises an electrode disposed so that at least a portion of each of the gate dielectric layers is between a channel region of each of the transistors and the electrode, wherein the first gate dielectric layer is direct contact to an electrode of the first gate structure, and wherein the thickness of each of the gate dielectric layers is measured as a thickness of the gate dielectric layer between the electrode and the channel region of each of the transistors.

2. The device of claim 1 wherein the gate structure of the third transistor additionally comprises a high-k dielectric layer disposed so that at least a portion of the high-k dielectric layer is between the electrode and the channel region of the transistor.

3. The device of claim 1 or 2 wherein the gate structure of the fourth transistor additionally comprises a high-k dielectric layer disposed so that at least a portion of the high-k dielectric layer is between the electrode and the channel region of the transistor.

4. The device of claim 1 wherein the substrate additionally comprises a source and a drain for each transistor.

5. The device of claim 1 wherein a high-k dielectric layer material is selected from the group consisting of hafnium dioxide, hafnium silicon oxide, lanthanum oxide, lanthanum aluminum oxide, zirconium dioxide, zirconium silicon oxide, titanium dioxide, tantalum oxide, barium strontium titanium oxide, barium titanium oxide, strontium titanium oxide, yttrium oxide, aluminum oxide, lead scandium tantalum oxide, and lead zinc niobate.

6. The device of claim 1 wherein the electrode is comprised of a material selected from the group consisting of hafnium, zirconium, titanium, tantalum, aluminum, titanium nitride, titanium carbide, zirconium carbide, tantalum carbide, hafnium carbide, aluminum carbide, ruthenium, palladium, platinum, cobalt, nickel, and ruthenium oxide.

7. The device of claim 1 wherein the first high-k dielectric layer has a thickness of between 1 nm and 4 nm.

8. The device of claim 1 wherein the second high-k dielectric layer has a thickness of between 1 nm and 4 nm.

9. The device of claim 1 wherein the first silicon dioxide layer has a thickness of between 1 nm and 6 nm.

10. The device of claim 1 wherein the second silicon dioxide layer has a thickness of between 1 nm and 6 nm.

11. A device comprising,
at least three different types of transistors on a substrate, wherein the transistors each comprise a gate structure, wherein the gate structure of a first transistor comprises a first gate dielectric layer comprising a first high-k dielectric layer having a first thickness, the gate structure of a second transistor comprises a second gate dielectric layer comprising a second high-k dielectric layer having a second thickness, wherein the first and the second high-k dielectric layer thicknesses are not the same,
wherein the gate structure of a third transistor comprises a silicon dioxide layer having a third thickness, and
wherein the gate structure of each of the transistors additionally comprises an electrode disposed so that at least a portion of each of the gate dielectric layers is between a channel region of each of the transistors and the electrode, wherein the first gate dielectric layer is direct contact to an electrode of the first gate structure, and wherein the thickness of each of the gate dielectric layers is measured as a thickness of the gate dielectric layer between the electrode and the channel region of each of the transistors.

12. The device of claim 11 wherein the gate structure of the third transistor additionally comprises a high-k dielectric layer disposed so that at least a portion of the high-k dielectric layer is between the electrode and the channel region of the transistor.

13. The device of claim 11 wherein the gate structure of the second transistor additionally comprises a silicon dioxide layer disposed so that at least a portion of the silicon dioxide layer is between the electrode and the channel region of the transistor.

14. The device of claim 11 wherein the substrate additionally comprises a source and a drain for each transistor.

15. The device of claim 11 wherein a high-k dielectric layer material is selected from the group consisting of hafnium dioxide, hafnium silicon oxide, lanthanum oxide, lanthanum aluminum oxide, zirconium dioxide, zirconium silicon oxide, titanium dioxide, tantalum oxide, barium strontium titanium oxide, barium titanium oxide, strontium titanium oxide, yttrium oxide, aluminum oxide, lead scandium tantalum oxide, and lead zinc niobate.

16. The device of claim 11 wherein the electrode is comprised of a material selected from the group consisting of hafnium, zirconium, titanium, tantalum, aluminum, titanium nitride, titanium carbide, zirconium carbide, tantalum carbide, hafnium carbide, aluminum carbide, ruthenium, palladium, platinum, cobalt, nickel, and ruthenium oxide.

17. The device of claim 11 wherein the first high-k dielectric layer has a thickness of between 1 nm and 4 nm.

18. The device of claim 11 wherein the second high-k dielectric layer has a thickness of between 1 nm and 4 nm.

19. The device of claim 11 wherein the silicon dioxide layer has a thickness of between 1 nm and 6 nm.

\* \* \* \* \*